US011330698B2

(12) United States Patent
Lee et al.

(10) Patent No.: US 11,330,698 B2
(45) Date of Patent: May 10, 2022

(54) METHOD FOR EXPANDING SHEATH AND BULK OF PLASMA BY USING DOUBLE RADIO FREQUENCY

(71) Applicant: POSTECH ACADEMY-INDUSTRY FOUNDATION, Pohang-si (KR)

(72) Inventors: Ji Mo Lee, Anyang-si (KR); Gun Su Yun, Pohang-si (KR); Jae Koo Lee, Pohang-si (KR); Seung Taek Lee, Pohang-si (KR); Woo Jin Nam, Busan (KR); Won Seok Kim, Pohang-si (KR)

(73) Assignee: Postech Academy-Industry Foundation, Pohang-si (KR)

( * ) Notice: Subject to any disclaimer, the term of this patent is extended or adjusted under 35 U.S.C. 154(b) by 0 days.

(21) Appl. No.: 16/770,043

(22) PCT Filed: Aug. 28, 2018

(86) PCT No.: PCT/KR2018/009898
§ 371 (c)(1),
(2) Date: Jun. 4, 2020

(87) PCT Pub. No.: WO2019/112148
PCT Pub. Date: Jun. 13, 2019

(65) Prior Publication Data
US 2020/0389967 A1     Dec. 10, 2020

(30) Foreign Application Priority Data

Dec. 4, 2017   (KR) .................. 10-2017-0165416

(51) Int. Cl.
*H01J 37/32*     (2006.01)
*H05H 1/46*      (2006.01)

(52) U.S. Cl.
CPC ......... *H05H 1/46* (2013.01); *H01J 37/32082* (2013.01); *H01J 37/32201* (2013.01)

(58) Field of Classification Search
CPC ........... H01J 37/32009; H01J 37/32082; H01J 37/32146; H01J 37/32174;
(Continued)

(56) References Cited

U.S. PATENT DOCUMENTS

| 5,707,486 A * | 1/1998 | Collins ............. H01J 37/32082 |
| | | 156/345.38 |
| 6,899,054 B1 * | 5/2005 | Bardos .................. C23C 16/517 |
| | | 118/723 E |

(Continued)

FOREIGN PATENT DOCUMENTS

| JP | 2008-177131 A | 7/2008 |
| JP | 2014-519148 A | 8/2014 |

(Continued)

OTHER PUBLICATIONS

Written Opinion of International Application No. PCT/KR2018/009898 dated Nov. 27, 2018, 5 pages.

*Primary Examiner* — Tung X Le
(74) *Attorney, Agent, or Firm* — Morgan, Lewis & Bockius LLP

(57) ABSTRACT

The objective of the present disclosure is to provide a method of expanding the sheath and bulk of plasma using dual high frequencies, in which the sheath and bulk of microwave-generated plasma are expanded. The method of expanding the sheath and bulk of plasma using dual high frequencies according to one embodiment of the present disclosure includes: a generation step of generating plasma by a microwave plasma generator; and an expansion step of expanding the sheath and bulk of the plasma by applying a radio-frequency (RF) bias to a radio-frequency electrode disposed at a predetermined distance from the microwave plasma generator.

6 Claims, 7 Drawing Sheets

(58) Field of Classification Search
CPC ........... H01J 37/32201; H01J 37/32623; H01J 37/32642; H01J 37/32706
See application file for complete search history.

(56) References Cited

U.S. PATENT DOCUMENTS

| | | | | |
|---|---|---|---|---|
| 2003/0164142 | A1* | 9/2003 | Koshimizu | ....... H01J 37/32642 118/409 |
| 2004/0149221 | A1* | 8/2004 | Koshimizu | ....... H01J 37/32174 118/723 R |
| 2013/0023064 | A1* | 1/2013 | Marakhtanov | .......... H01L 22/20 438/5 |
| 2014/0003998 | A1* | 1/2014 | Franklin | ................... A61L 2/14 422/29 |
| 2014/0273485 | A1* | 9/2014 | Zhao | ................. H01L 21/67069 438/710 |

FOREIGN PATENT DOCUMENTS

| | | |
|---|---|---|
| KR | 2006-0134176 A | 12/2006 |
| KR | 10-0803338 B1 | 2/2008 |
| KR | 10-1012345 A | 3/2010 |
| KR | 10-1510446 B1 | 4/2015 |

\* cited by examiner

M.W   Discharge gas

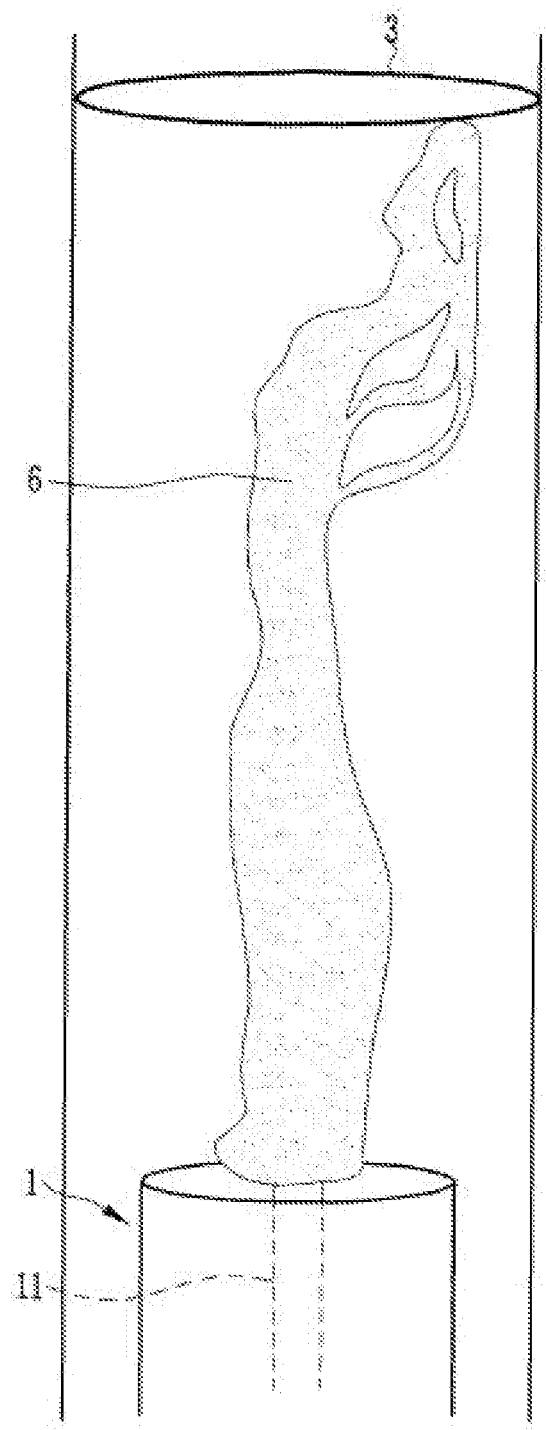

METHOD FOR EXPANDING SHEATH AND BULK OF PLASMA BY USING DOUBLE RADIO FREQUENCY

TECHNICAL FIELD

The present disclosure relates to a method for expanding the sheath and bulk of plasma, and more particularly, to a method of expanding the sheath and bulk of plasma using dual high frequencies, in which the sheath and bulk of microwave-generated plasma are expanded by applying radio-frequency to the plasma.

BACKGROUND ART

A device that generates plasma using microwaves is known. The microwave plasma generator disclosed in Korean Patent No. 10-1012345 generates plasma using resonance energy of a microwave having a frequency of 900 MHz or 2.45 GHz, which is applied through an inner conductor.

A connection member, a connection conductor, an outer conductor and an inner conductor are electrically connected to one another and function as a microwave-oscillating resonator. Air filled in the empty space between the outer jacket of a coaxial cable and the inner conductor is used as a dielectric material, and an inert gas injected into the empty space is used as a plasma ion source. The inert gas injected by the resonance energy of the conductors (i.e., a resonator) to which microwaves are supplied is changed into plasma and discharged.

When considering safety and plasma characteristics, microwave-generated plasma has more advantageous aspects than high-voltage plasma generated by direct current, low frequency, or radio-frequency (RF).

However, microwave plasma is disadvantageous for treating a large area with the plasma because it has a lower efficiency of plasma volume versus power consumption than low-frequency plasma.

In addition, the amount of active species (radicals) generated in plasma is proportional to the volume of the plasma. Therefore, in order to use the high-temperature electrons of microwave plasma more efficiently, the expansion of the plasma is required.

DISCLOSURE

Technical Problem one aspect of the present disclosure provides a method of expanding the sheath and bulk of plasma using dual high frequencies, in which the sheath and bulk of microwave-generated plasma are expanded.

Technical Solution

A method of expanding the sheath and bulk of plasma using dual high frequencies according to one embodiment of the present disclosure includes: a generation step of generating plasma by a microwave plasma generator; and an expansion step of expanding the sheath and bulk of the plasma by applying a radio-frequency (RF) bias to a radio-frequency electrode disposed at a predetermined distance from the microwave plasma generator.

According to one embodiment of the present disclosure, the generation step may generate the plasma by supplying discharge gas to the outer periphery of the microwave electrode of the microwave plasma generator and applying microwaves to the microwave electrode.

According to one embodiment of the present disclosure, the microwaves may have a frequency in the range of 0.4 to 11 GHz, and may be used as an electron source.

According to one embodiment of the present disclosure, the expansion step may expand the sheath and bulk of the plasma by applying a radio-frequency (RF) bias to the radio-frequency electrode disposed at a predetermined distance from the microwave electrode.

According to one embodiment of the present disclosure, the radio-frequency (RF) may be in the range of 1 kHz to 99 MHz.

According to one embodiment of the present disclosure, the generation step may generate the plasma at atmospheric pressure, and the expansion step may expand the sheath and bulk of the plasma at atmospheric pressure.

According to one embodiment of the present disclosure, the expansion step may increase the generation of active species (radicals) in the plasma whose sheath and bulk have been expanded, as compared to the microwave-only plasma generator with the equivalent power level.

According to one embodiment of the present disclosure, the method of expanding the sheath and bulk of plasma using dual high frequencies may further include an application step of applying the expanded plasma to any one of plasma torching, plasma jetting, surface treatment, and sterilization processing.

Advantageous Effects

According to one embodiment of the present disclosure described above, plasma may be generated by a microwave plasma generator, and the sheath and bulk of the generated plasma may be expanded by applying a radio-frequency (RF) bias to a radio-frequency electrode disposed at a predetermined distance from the microwave plasma generator.

As the sheath and bulk of the plasma are expanded, the kind and total amount of active species (radicals) generated in the plasma increase. Accordingly, when surface treatment with the plasma having increased active species is performed, the total area that can be treated may be increased.

Regardless of the kind of discharge gas that generates plasma, the sheath and bulk of the plasma may be increased, and the increase in sheath and bulk of the plasma may be maximized as compared to the microwave-only plasma generator with the equivalent power level. Therefore, the embodiment may be applied to various plasma fields.

BRIEF DESCRIPTION OF DRAWINGS

FIG. 7 is a photograph of an arc-shaped plasma which occurs when a very low RF (25 kHz) bias is applied to microwave-generated plasma by the method of expanding the sheath and bulk of plasma using dual high frequencies according to one embodiment of the present disclosure.

BEST MODE

Figure 1:
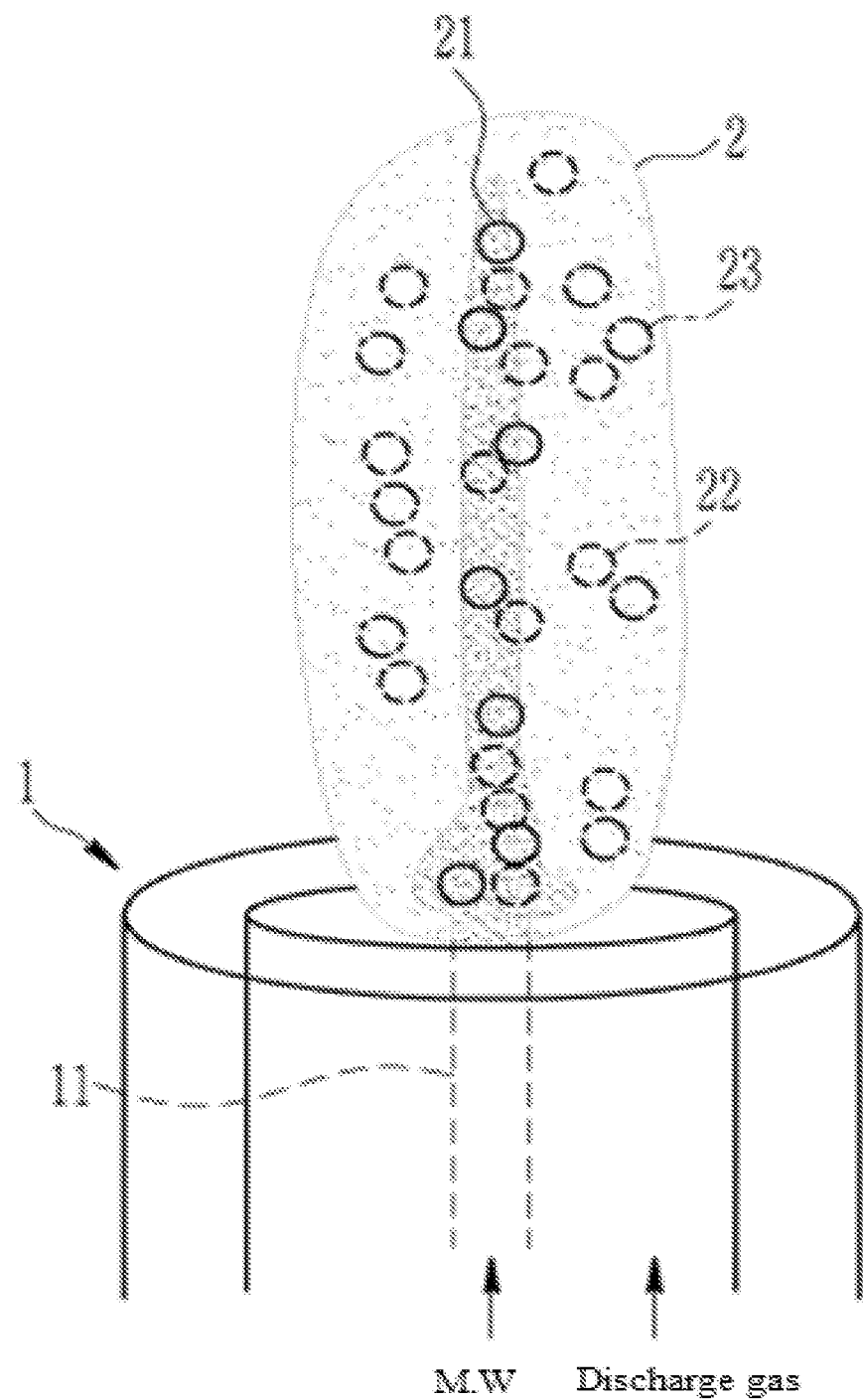
FIG. 1 is a view showing a state in which plasma is generated by microwaves alone according to a comparative embodiment.

Hereinafter, exemplary embodiments of the present disclosure will be described in detail with reference to the accompanying drawings so that those skilled in the art to which the present disclosure pertains can easily carry out the embodiments. However, the present disclosure may be embodied in various different forms and is not limited to the embodiments described herein. In the drawings, parts irrelevant to the description are omitted in order to clearly describe the present disclosure, and throughout the specification, the same reference numerals denote the same or similar elements.

Figure 2:
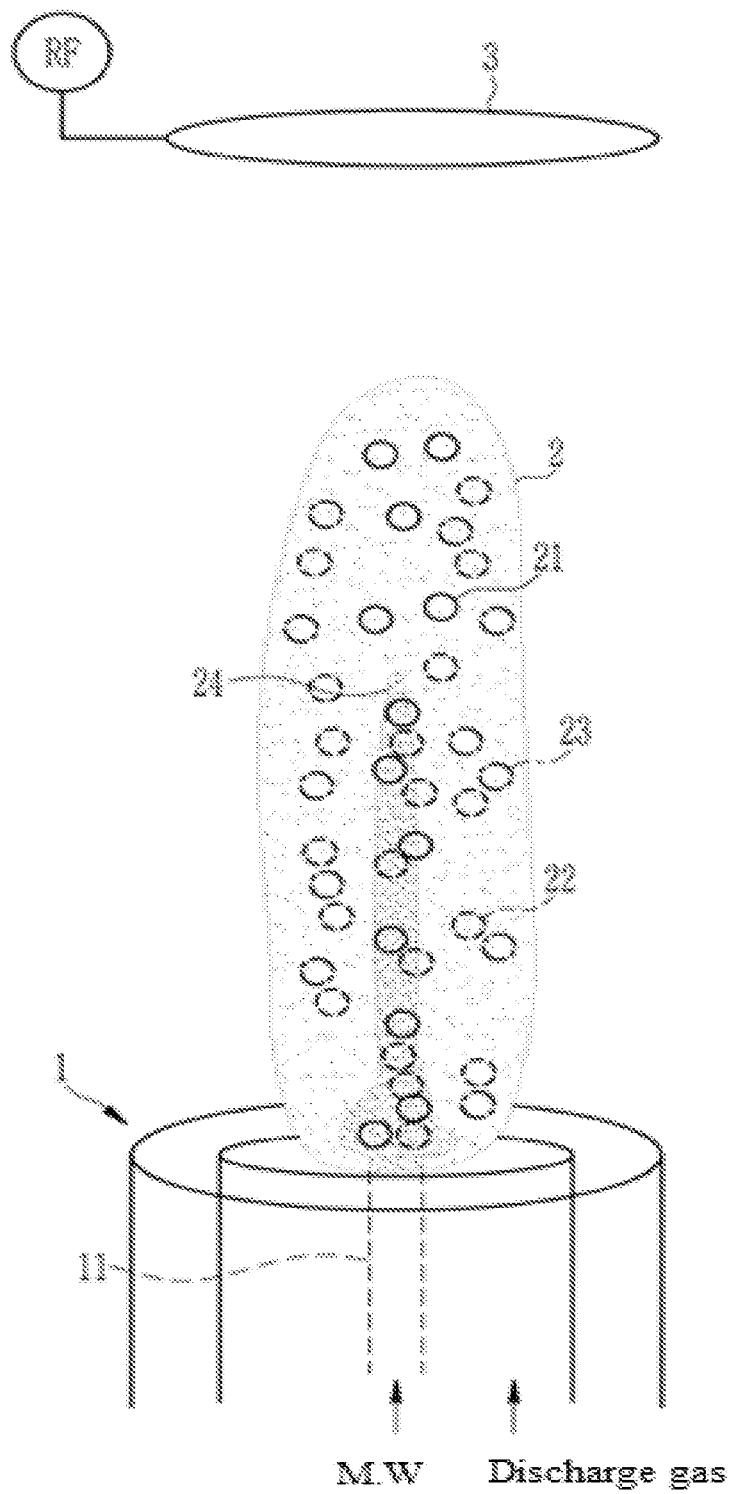
FIG. 2 is a view showing an initial state in which an RF bias with a first amplitude is applied to microwave-generated plasma by a method of expanding the sheath and bulk of plasma using dual high frequencies according to one embodiment of the present disclosure.

FIG. 1 is a view showing a state in which plasma is generated by microwaves alone according to a comparative embodiment, and FIG. 2 is a view showing an initial state in which an RF bias with a first amplitude is applied to microwave-generated plasma by a method of expanding the sheath and bulk of plasma using dual high frequencies according to one embodiment of the present disclosure.

Referring to FIGS. 1 and 2, the method of expanding the sheath and bulk of plasma using dual high frequencies according to one embodiment of the present disclosure expands the sheath and bulk of microwave-generated plasma using dual high frequencies.

According to one embodiment of the present disclosure, the use of dual high frequencies that are electrically separated may increase the size of plasma by several times or more when a single frequency is used. Thus, one embodiment of the present disclosure is different from conventional multi-frequency plasma generation and radio-frequency (RF) bias technologies that are used in conventional plasma systems for semiconductor processing, and the like.

Conventional multi-frequency plasma systems are operated at low pressure below atmospheric pressure, and a radio-frequency (RF) bias is applied mainly to the lower surface of a substrate in order to control the energy distribution of ions flowing onto the surface of the substrate. In contrast, one embodiment of the present disclosure makes it possible to expand the sheath and bulk of the atmospheric pressure plasma generated by microwaves, and maximize the amount of active species (radicals) generated.

To this end, the method according to one embodiment of the present disclosure includes: a generation step of generating plasma 2 by a microwave plasma generator 1 (see FIG. 1); and an expansion step of expanding the sheath and bulk of the plasma 2 (see FIG. 2). The generation step generates the plasma 2 using microwaves and discharge gas at atmospheric pressure, and the expansion step expands the sheath and bulk of the generated plasma 2 at atmospheric pressure. That is, the generation and expansion of the plasma is independent of ambient pressure. The plasma 2 contains electrons 21, cations 22, and neutral atoms 23.

The expansion step expands the sheath and bulk of the plasma 2, generated by the microwave plasma generator 1, by applying a radio-frequency (RF) bias to a radio-frequency electrode 3 disposed at a predetermined distance D from the microwave plasma generator 1.

The generation step generates the plasma 2 by supplying discharge gas to the outer periphery of a microwave electrode 11 of the microwave plasma generator 1 and applying microwaves (MW) to the microwave electrode 11. The kind and flow rate of discharge gas that is supplied in the generation step are not particularly limited.

The expansion step expands the sheath and bulk of the plasma 2, generated by the microwave electrode 11, by applying a radio-frequency (RF) bias to the radio-frequency electrode 3 disposed at a predetermined distance D from the microwave electrode 11.

For example, the plasma generator 1 is formed in a cylindrical shape, and the microwave electrode 11 is formed in a cylindrical shape to generate the plasma 2 in a cylindrical shape. The radio-frequency electrode 3 is disposed at a predetermined distance D from the end of each of the plasma generator 1 and the microwave electrode 11. In addition, the radio-frequency electrode 3 is formed in a circular ring shape so as to be able to effectively expand the sheath and bulk of the cylindrical plasma 2.

Referring to FIG. 2, in an initial stage in which a radio-frequency (RF) bias is applied to the radio-frequency electrode 3, the electrons 21 accelerated by a radio-frequency electric field are discharged in the direction of an axis (24) of the plasma 2 (the up and down direction in FIG. 2), and as the cations 22 and neutral atoms 23 are discharged in the direction of the axis 24 (the up and down direction in FIG. 2) in proportion to the discharge of the electrons 21, the sheath and bulk of the plasma 2 are widened (the left and right direction in FIG. 2).

The expansion step increases the generation of active species (radicals) in the plasma 2 whose sheath and bulk have been expanded, as compared to the microwave-only plasma generator 1 with the equivalent power level. In the case of argon low-temperature plasma generated by dual high frequencies in the air, the molecular spectral emission of molecules such as OH and $N_2$ in the expanded region of the plasma 2 as shown in FIG. 2 is increased due to the RF bias applied to the radio-frequency electrode 3. Thus, one embodiment of the present disclosure may be widely applied to the biomedical field where the generation of active species (radicals) versus input power is important.

For example, the microwaves (MW) that are applied to the microwave electrode 11 have a frequency in the range of 0.4 to 11 GHz, and are used as the source of the electrons 21 in the plasma 2. The radio-frequency (RF) that is applied to the radio-frequency electrode 3 is in the range of 1 kHz to 99 MHz.

If the radio-frequency (RF) that is applied to the radio-frequency electrode 3 is a low frequency or a very low radio-frequency (less than several tens of kHz), the expansion of the sheath and bulk of the plasma does not appear, or the radio-frequency leads to the expansion of the bulk of an arc-shaped plasma only by a high voltage (see FIG. 7). In addition, the expansion of the sheath and the bulk of the plasma does not appear even when microwaves having a frequency in a similar range are applied.

As such, only when the microwaves (MW) are used as a main power source and applied to the microwave electrode 11 and the relatively low radio-frequency (RF) with the first amplitude is applied to the radio-frequency electrode 3, the sheath and bulk of the plasma 2 are expanded.

As such, according to one embodiment of the present disclosure, a low-power radio-frequency (RF) is applied to the microwave electrode 11, whereby it is possible to maximize the sheath and bulk of the plasma 2 while maintaining the low-temperature characteristics of existing atmospheric pressure microwave plasma. When the sheath and bulk of the low-temperature microwave plasma 2 are expanded at atmospheric pressure, the amount of ozone generated does not differ from that when the sheath and the bulk of the plasma are not expanded. That is, when the plasma 2 is expanded, ozone is not additionally generated.

Figure 3:
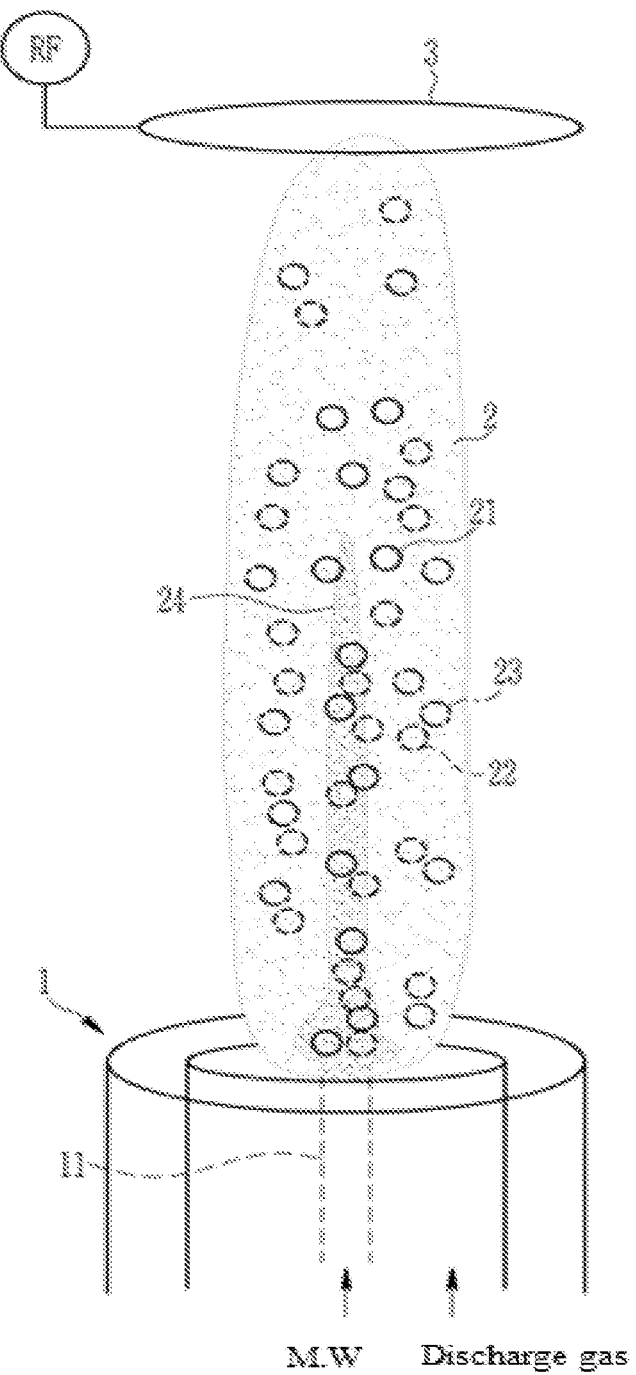
FIG. 3 is a view showing a state in which an RF bias with a second amplitude (>the first amplitude) is applied to microwave-generated plasma by the method of expanding the sheath and bulk of plasma using dual high frequencies according to one embodiment of the present disclosure.

FIG. 3 is a view showing a state in which an RF bias with a second amplitude (>the first amplitude) is applied to microwave-generated plasma by the method of expanding the sheath and bulk of plasma using dual high frequencies according to one embodiment of the present disclosure.

Referring to FIG. 3, under the same conditions as those in FIG. 2, an RF bias with a second amplitude greater than the first amplitude is applied to the radio-frequency electrode 3, and thus the RF bias with the second amplitude greater than the first amplitude is applied to the plasma 2 generated by microwaves. In this case, the sheath and bulk of the plasma 2 were increased in proportion to the difference in the amplitude.

Figure 4:
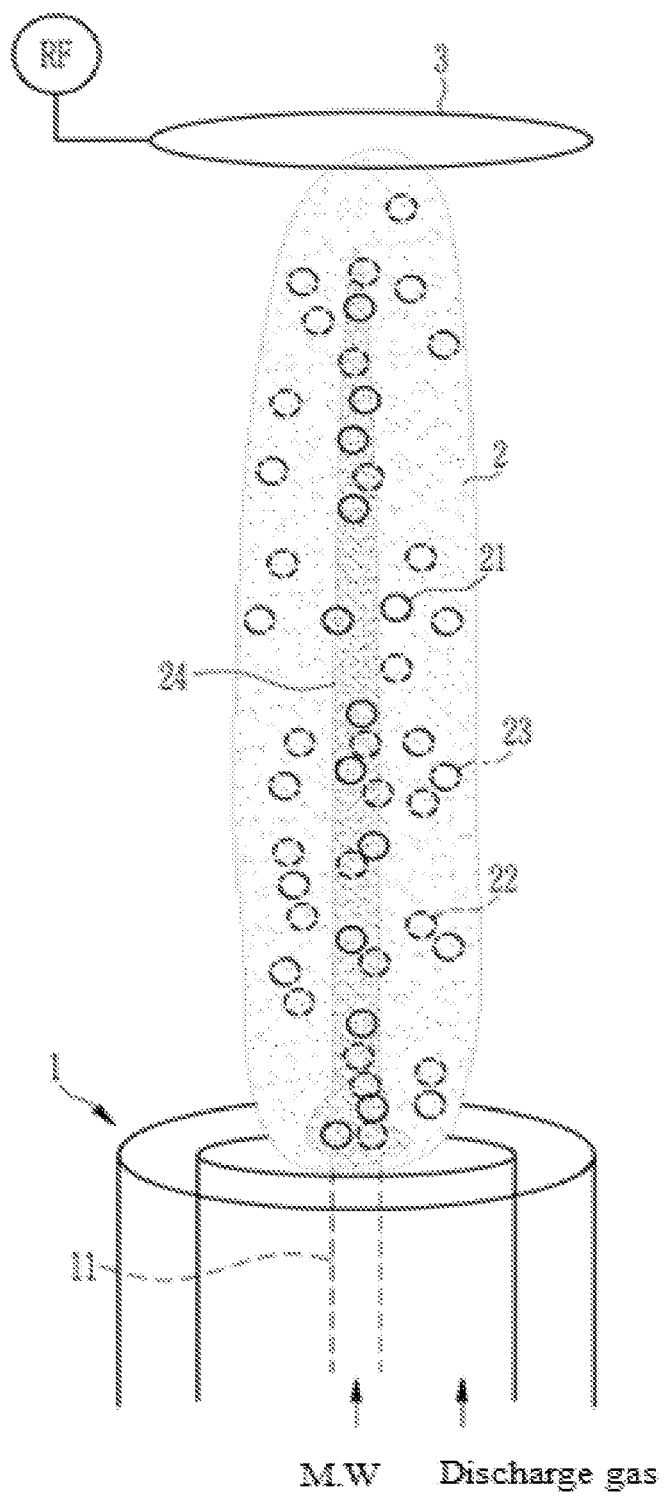
FIG. 4 is a view showing a state in which an RF bias with a third amplitude (the greatest amplitude) is applied to microwave-generated plasma by the method of expanding the sheath and bulk of plasma using dual high frequencies according to one embodiment of the present disclosure.

FIG. 4 is a view showing a state in which an RF bias with a third amplitude (the greatest amplitude) is applied to microwave-generated plasma by the method of expanding the sheath and bulk of plasma using dual high frequencies according to one embodiment of the present disclosure.

Referring to FIG. 4, under the same conditions as those in FIGS. 2 and 3, an RF bias with a third amplitude (the greatest amplitude) greater than the second amplitude is applied to the radio-frequency electrode 3, and thus the RF bias with the third amplitude (the greatest amplitude) greater than the second amplitude is applied to the plasma 2 generated by microwaves. In this case, between the microwave electrode 11 and the radio-frequency electrode 3, the sheath and bulk of the plasma 2 are increased to the maximum.

As such, according to one embodiment of the present disclosure, the radio-frequency (RF) bias is applied to the radio-frequency electrode 3 to the radio-frequency electrode 3 electrically separated at a position spaced at the predetermined distance D apart from the steady-state high-density plasma 2 generated from the microwave plasma generator 1 including the microwave electrode 11, whereby a plasma channel C may be formed by the sheath and bulk expanded between the end of the steady-state plasma 2 and the RF electrode 3.

In the expansion step, the sheath region of the plasma 2 is lengthened while the electrons 21 of the steady-state plasma 2 are primarily accelerated by the RF electric field. That is, the electrons 21 accelerated by the radio-frequency field are discharged in the direction of the axis 24 of the plasma 2 (the up and down direction in FIG. 4). Thereafter, the bulk of the plasma 2 is increased while the cations 22 and neutral atoms 23 slower than the electrons 21 are discharged and diffused toward the extended sheath region (in the direction of the axis 24).

The volume of the plasma is determined by the kind and flow rate of the discharge gas used during gas discharge, ambient pressure, input power, input frequency, the geometry of the microwave electrode, and the like. However, the increase in the plasma volume is essentially limited. According to the prior art, in order to double the plasma volume that has reached saturation, several times higher power or a newly designed electrode is required.

In contrast, one embodiment of the present disclosure is an efficient method that may more than double the plasma volume with low power by applying the RF bias to the radio-frequency electrode 3 at a position spatially separated from the microwave electrode 11.

Minimizing the enormous amount of ozone generated in existing plasma systems is an essential requirement for the application to biomedical fields. One embodiment of the present disclosure is a flexible method that can maximize the plasma volume independently of the kind and flow rate of discharge gas, pressure, input power, etc., while satisfying this requirement.

Figure 5:
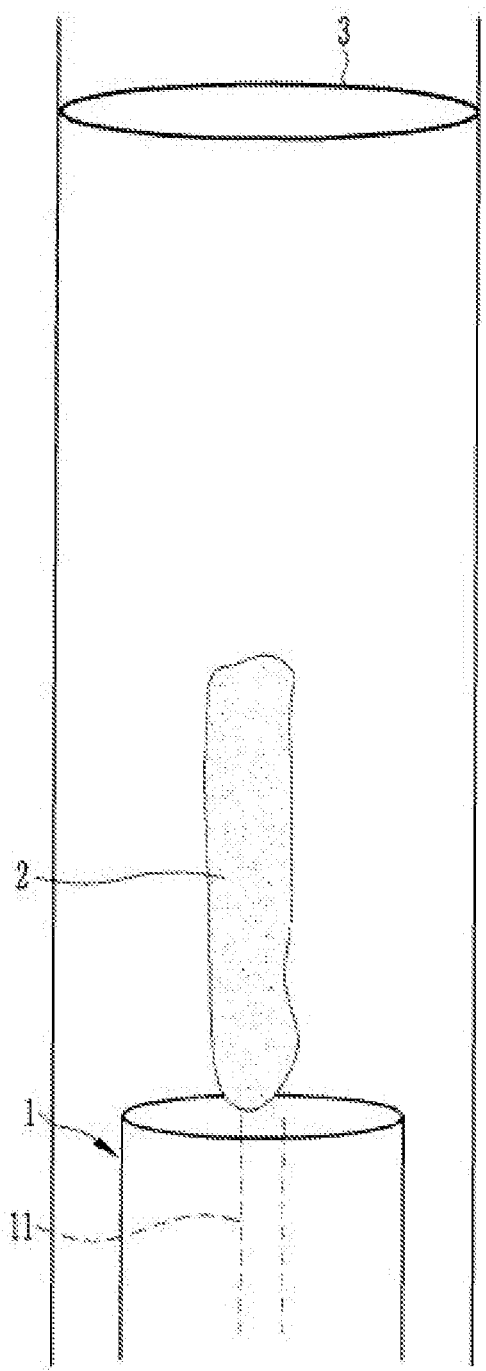
FIGS. 5 and 6 are photographs comparing before and after an RF bias is applied to microwave-generated plasma by the method of expanding the sheath and bulk of plasma using dual high frequencies according to one embodiment of the present disclosure.
Figure 6:
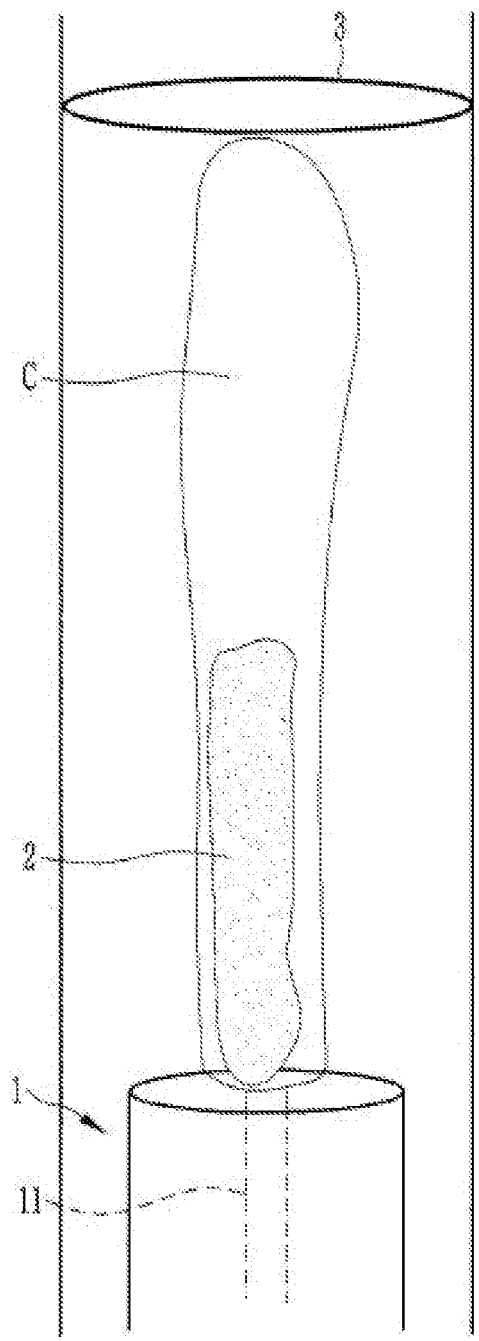

FIGS. 5 and 6 are photographs comparing before and after an RF bias is applied to microwave-generated plasma by the method of expanding the sheath and bulk of plasma using dual high frequencies according to one embodiment of the present disclosure.

Referring to FIG. 5, the steady-state high-density plasma 2 is generated at the end of the microwave electrode 11 by the microwaves (900 MHz) applied to the microwave electrode 11.

Referring to FIG. 6, the sheath and bulk of the plasma 2 are expanded between the end of the steady-state high-density plasma 2 and the radio-frequency (RF) electrode 3 by applying a radio-frequency (RF) (3 MHz) bias to the RF electrode 3 electrically separated at a position spaced at the predetermined distance D apart from the steady-state high-density plasma 2, whereby the plasma channel C is formed.

FIG. 7 is a photograph of an arc-shaped plasma which occurs when a very low RF (25 kHz) bias is applied to microwave-generated plasma by the method of expanding the sheath and bulk of plasma using dual high-frequencies according to one embodiment of the present disclosure.

Referring to FIG. 7, when a radio-frequency (RF) (25 kHz) bias is applied to the radio-frequency electrode 3, the plasma channel C shown in FIG. 6 is not formed, but an arc-shaped plasma 6 is generated. The expansion of the sheath and bulk of plasma can occur only in a specific range of radio-frequency (RF). The frequency range of several tens of kHz or less requires an electrically dangerous high-voltage and produces a large amount of ozone harmful to the respiratory system.

Meanwhile, one embodiment of the present disclosure may further include an application step. In the application step, the plasma 2 expanded in the expansion step is applied to at least one of plasma torching, plasma jetting, surface treatment, sterilization processing, cancer cell treatment, cosmetic treatment, wound treatment, and blood clotting treatment.

According to the prior art, thin plasma, which is generated from the microwave electrode and jetted out, can be applied to various fields, such as precision therapy that induces local cancer cell death, cosmetic treatment in the biomedical field, wound healing, blood clotting, and the like.

According to one embodiment of the present disclosure, the plasma 2 whose sheath and bulk have been expanded can treat a large surface area. Therefore, the plasma expanded according to one embodiment of the present disclosure may be applied to plasma torching, plasma jetting, surface treatment, metal surface treatment, or sterilization processing, etc., because there is no limit to the composition of the plasma.

Although the preferred embodiments of the present disclosure have been described above, it is to be understood that the present disclosure is not limited thereto and various modifications are possible within the scope of the appended claims, the detailed description of the disclosure, and the accompanying drawings, and also fall within the scope of the present disclosure.

DESCRIPTION OF REFERENCE NUMERALS

1: Microwave plasma generator
2: Plasma
3: Radio-frequency electrode
11: Microwave electrode
C: Plasma channel
D: Predetermined distance
MW: Microwaves

The invention claimed is:

1. A method of generating plasma using a microwave frequency and expanding a sheath and bulk of the plasma using a radio frequency, the method comprising:
  a generation step of generating the plasma by a microwave plasma generator using the microwave frequency; and
  an expansion step of expanding the sheath and bulk of the plasma generated in the generation step, wherein the expansion step expands the sheath and bulk of the plasma using the radio frequency by applying a radio-frequency (RF) bias to a radio-frequency electrode disposed at a predetermined distance from the microwave plasma generator,
  wherein:
  the expansion step is performed after the generation step;
  the expansion step is separate from the generation step;
  the plasma generated in the generation step is a steady-state plasma generated at an end of a microwave electrode of the microwave plasma generator by microwaves applied to the microwave electrode;
  in the expansion step, the sheath and bulk of the plasma are lengthened in a direction along a first length between an end of the steady-state plasma and the radio-frequency electrode to form a plasma channel between the end of the microwave electrode and the radio-frequency electrode,
  the steady-state plasma has the first length and a first width;
  the microwave electrode has a second length and a second width;
  the plasma channel has a third length and a third width;
  the first length, the second length and the third length are parallel to one another;
  the first length, the second length and the third length are perpendicular to the end of the microwave electrode and the radio-frequency electrode;
  each of the first length, the second length and the third length is perpendicular to the first width, the second width and the third width, respectively;
  each of the first length, the second length and the third length is longer than the first width, the second width and the third width, respectively;
  in the generation step, the radio-frequency electrode is not reachable by the plasma;
  in the expansion step, the radio-frequency electrode is reachable by the plasma channel; and
  the microwave frequency and the radio frequency are electrically separated.

2. The method of claim 1, wherein the radio-frequency electrode is in a ring shape, and wherein the second length is longer than the second width.

3. The method of claim 2, wherein each of the microwave electrode and the microwave plasma generator is formed in a cylindrical shape to generate the plasma in a cylindrical shape.

4. The method of claim 1, wherein the microwave frequency is in a range of 0.4 to 11 GHz, the microwaves are used as an electron source, and the radio frequency is in a range of 1 kHz to 99 MHz.

5. The method of claim 1, wherein the generation step generates the plasma at atmospheric pressure, and the expansion step expands the sheath and bulk of the plasma at atmospheric pressure.

6. The method of claim 1, wherein the microwave plasma generator is a microwave-only plasma generator that enables the plasma to be generated in the generation step without using the radio frequency.

* * * * *